(12) United States Patent
Bhardwaj et al.

(10) Patent No.: US 6,381,283 B1
(45) Date of Patent: Apr. 30, 2002

(54) INTEGRATED SOCKET WITH CHIP CARRIER

(75) Inventors: Vinod K. Bhardwaj, San Jose, CA (US); Larry W. Haugen, Lincoln City, OR (US)

(73) Assignee: ControlNet, Inc., Campbell, CA (US)

( * ) Notice: Subject to any disclaimer, the term of this patent is extended or adjusted under 35 U.S.C. 154(b) by 0 days.

(21) Appl. No.: 09/168,225

(22) Filed: Oct. 7, 1998

(51) Int. Cl.$^7$ .................................................. H04B 3/00
(52) U.S. Cl. ...................................... 375/257; 375/219
(58) Field of Search ................................ 375/257, 219, 375/222; 439/119, 394, 552, 494, 498, 823, 522, 620, 660, 676

(56) References Cited

U.S. PATENT DOCUMENTS

| | | | |
|---|---|---|---|
| 4,092,629 A | * | 5/1978 | Siems et al. ................. 367/79 |
| 4,602,838 A | | 7/1986 | Davis et al. |
| 4,603,320 A | | 7/1986 | Farago |
| 4,607,170 A | | 8/1986 | Wickman |
| 4,620,762 A | | 11/1986 | Davis et al. |
| 4,648,665 A | | 3/1987 | Davis et al. |

(List continued on next page.)

FOREIGN PATENT DOCUMENTS

| | | |
|---|---|---|
| EP | 0 515 153 | 11/1992 |
| WO | 94/01987 | 1/1994 |
| WO | 98/06152 | 2/1998 |

*Primary Examiner*—Chi Pham
*Assistant Examiner*—Emmanuel Bayard
(74) *Attorney, Agent, or Firm*—Beyer Weaver & Thomas, LLP

(57) ABSTRACT

An integrated module incorporates not only a cable socket, but also a chip carrier for an integrated circuit and a daughter card for discrete components. The module can be mounted on any printed circuit board, within a switch, router, hub or other network device. A network socket, one or more integrated circuits and all discrete components (resistors, capacitors, coil, etc.) are contained within the module. The functionality of a transceiver and a media access controller are split into a digital portion and an analog portion. Each of the digital and analog functionality is implemented on a separate integrated circuit and both integrated circuits are placed next to one another in the chip carrier within the integrated module. Shielding around the socket is extended to surround the entire integrated module. The metal shielding extends underneath the integrated module and contacts the copper base of the chip carrier to serve as a heat sink. Any number of integrated modules are ganged together and a single electromagnetic shield placed around all of the integrated modules. A light pipe is used in conjunction with the socket instead of traditional light-emitting diodes. A chip carrier by itself has pins bent both downward to interface to a particular device such as computer board, network switch, hub, router, etc., and pins bent upward to attach to an above daughter card. A chip carrier also contains one or more integrated circuits and a daughter card mounted on top of the chip carrier.

47 Claims, 14 Drawing Sheets

U.S. PATENT DOCUMENTS

| | | |
|---|---|---|
| 4,686,506 A | 8/1987 | Farago |
| 4,993,956 A | 2/1991 | Pickles et al. |
| 5,015,204 A | 5/1991 | Sakamoto et al. |
| 5,069,641 A | 12/1991 | Sakamoto et al. |
| 5,091,826 A | 2/1992 | Arnett et al. |
| 5,101,322 A | 3/1992 | Ghaem et al. |
| 5,132,877 A | 7/1992 | Branan et al. |
| 5,139,422 A | 8/1992 | Sakamoto et al. |
| 5,158,470 A * | 10/1992 | Zarreii ................ 439/79 |
| 5,181,852 A | 1/1993 | Dambach et al. |
| 5,184,282 A * | 2/1993 | Kaneda et al. ............ 361/737 |
| 5,223,806 A | 6/1993 | Curtis et al. |
| 5,435,734 A | 7/1995 | Chow |
| 5,445,526 A | 8/1995 | Hoshino et al. |
| 5,477,418 A | 12/1995 | MacGregor et al. |
| 5,546,457 A * | 8/1996 | Tomura et al. ........... 379/368 |
| 5,562,507 A | 10/1996 | Kan |
| 5,621,363 A | 4/1997 | Ogden et al. |
| 5,628,055 A * | 5/1997 | Stein ..................... 455/575 |
| 5,639,267 A | 6/1997 | Loudermilk |
| 5,647,765 A | 7/1997 | Hass et al. |
| 5,647,767 A * | 7/1997 | Scheer et al. ............ 439/620 |
| 5,687,233 A | 11/1997 | Loudermilk et al. |
| 5,702,271 A | 12/1997 | Steinman |
| 5,704,802 A | 1/1998 | Loudermilk |
| 5,736,910 A | 4/1998 | Townsend et al. |
| 5,741,152 A | 4/1998 | Boutros |
| 5,759,067 A | 6/1998 | Scheer |
| 5,775,946 A | 7/1998 | Briones |
| 6,024,500 A * | 2/2000 | Wolf ..................... 385/92 |
| 6,062,908 A * | 5/2000 | Jones ..................... 439/620 |

* cited by examiner

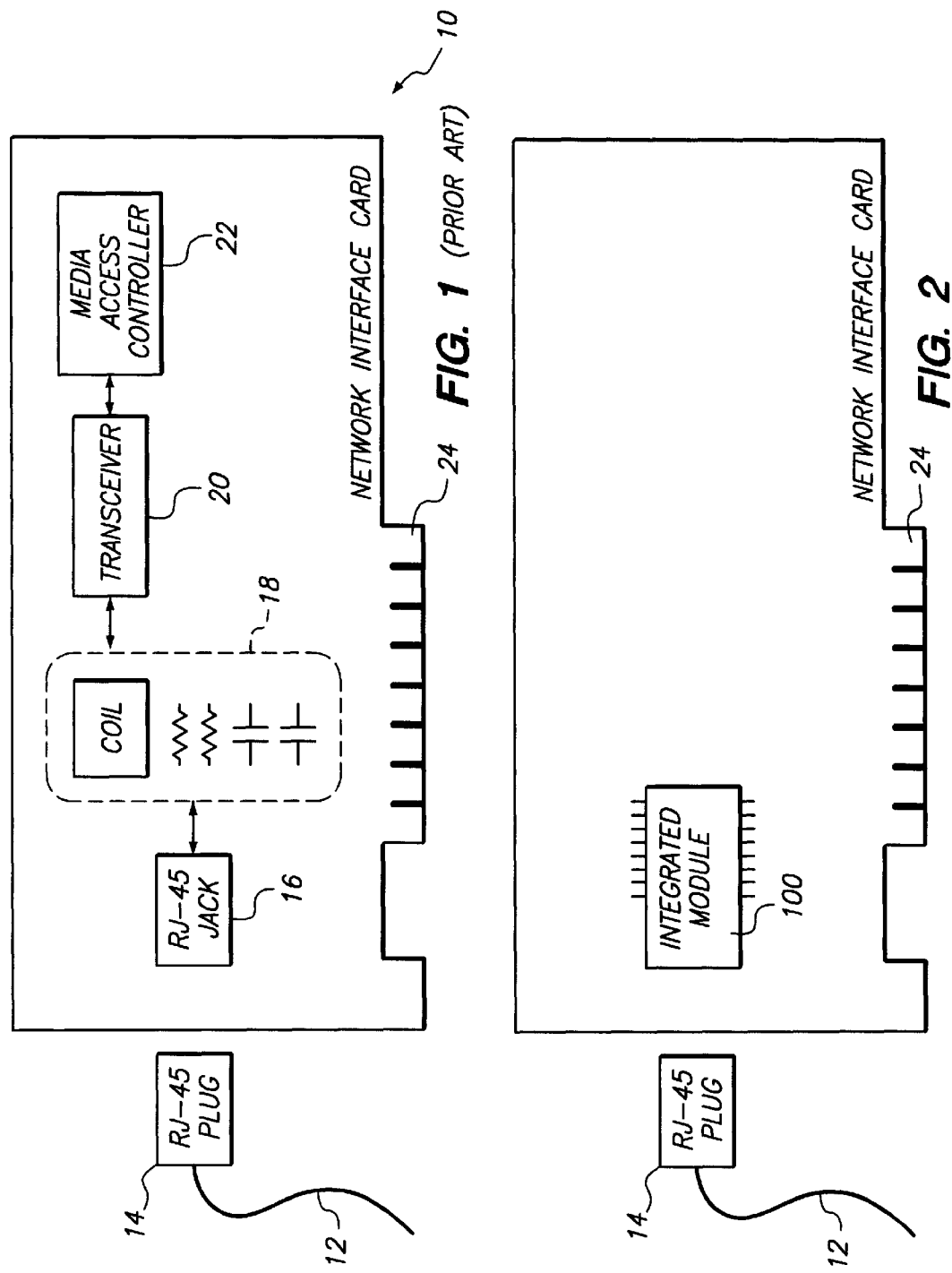

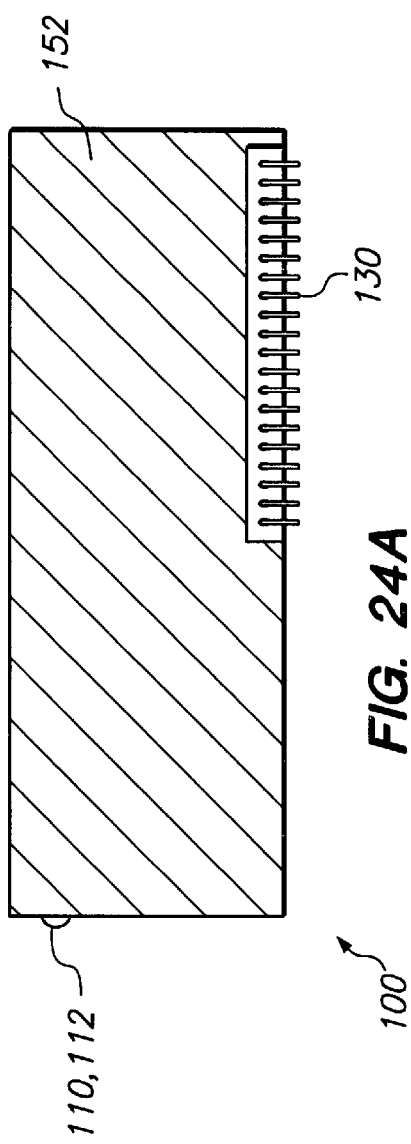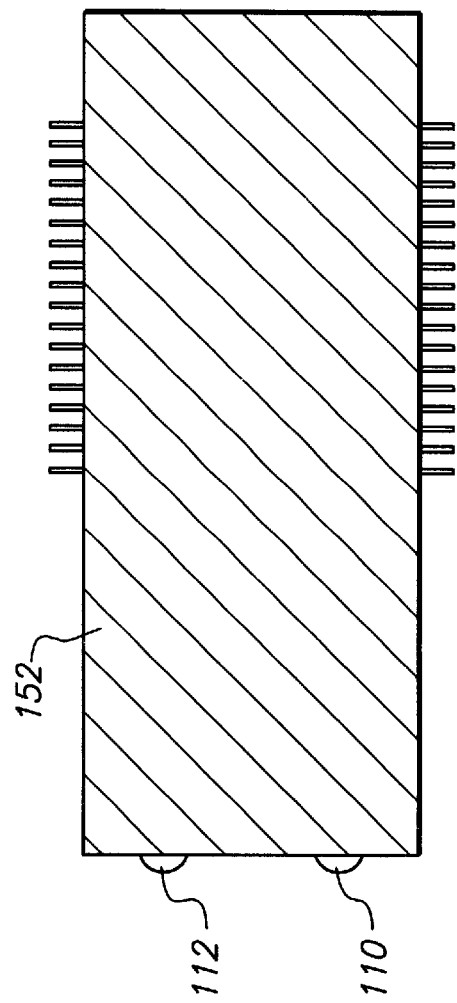

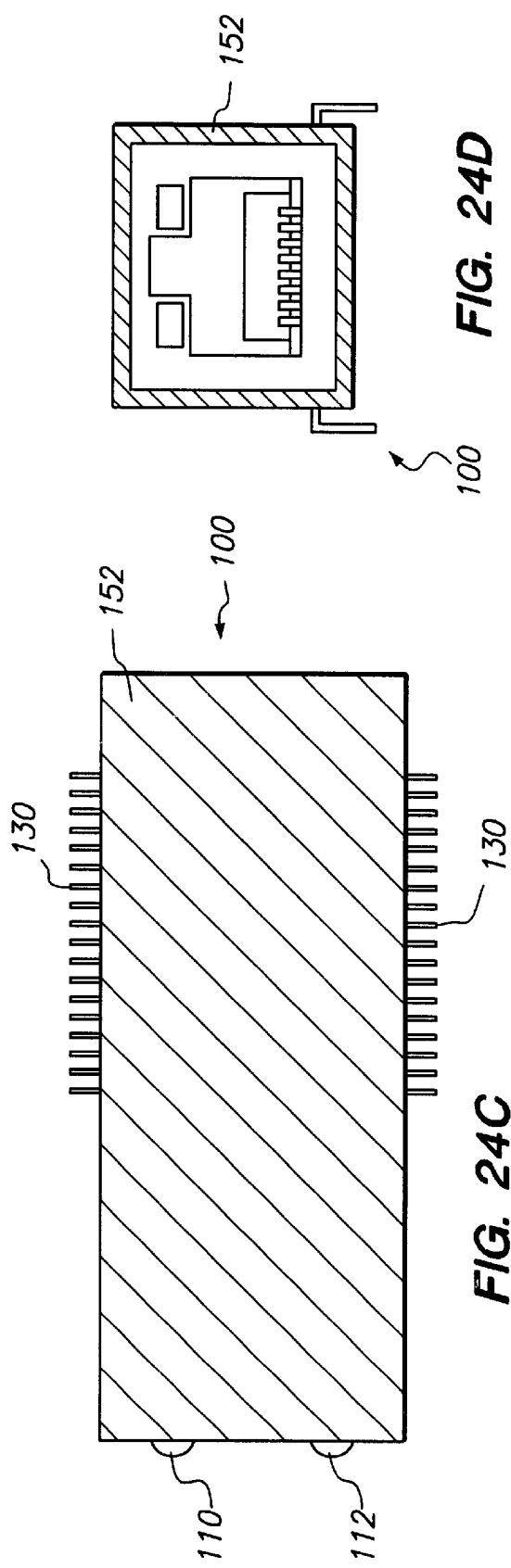
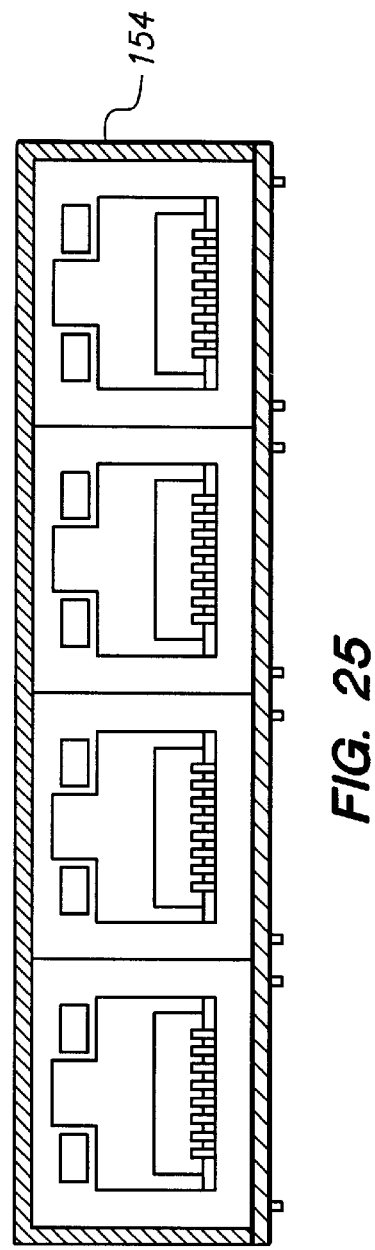

INTEGRATED SOCKET WITH CHIP CARRIER

FIELD OF THE INVENTION

The present invention relates generally to network communications. More specifically, the present invention relates to a network cable socket (or plug) that is integrated with a chip carrier and associated circuitry.

BACKGROUND OF THE INVENTION

Communication between computers and network devices typically occurs over cables that are connected to a hardware device using a pair of male and female connectors. A cable is typically terminated at each end by a male plug (or connector) which connects to a female jack (or socket) mounted on a printed circuit board or within a hardware device.

FIG. 1 illustrates a prior art network interface card (NIC) 10 that includes a jack 16 and supporting circuitry. Network interface card 10 is used to interface analog signals from a network cable to a computer. In this example, NIC 10 is an Ethernet card. Shown is an Ethernet communications cable 12 terminating in an RJ-45 plug 14. Plug 14 mates with RJ-45 jack 16 which is mounted on NIC 10. Also mounted on NIC 10 is a variety of analog circuitry 18 which is in communication with jack 16 and with a transceiver integrated circuit 20.

Jacks such as RJ-45 jack 16 are known in the art. Jack 16 may also include electromagnetic shielding around its plastic casing to shield the internal connections from outside circuitry and vice-versa. Some RJ-45 jacks also include a coil and/or LEDs within the jack itself.

Analog circuitry 18 includes discrete components such as inductance coils, resistors and capacitors, all which are useful in the processing of the analog signal over cable 14. Transceiver 20 is a known device that performs low-level processing of a communications signal. Transceiver 20 includes A/D and D/A converters and other related circuitry. By way of example, transceiver 20 is an Intel 82555 device. Media access controller (MAC) integrated circuit 22 is also a known device that performs high level processing of the communications signal and is in communication with transceiver 20 and a computer bus interface 24. MAC 22 provides the high-level interface to the computer bus and to the computer software. By way of example, MAC 22 is an Intel 82557 device. Computer bus interface 24 is an interface from NIC 10 to a computer bus of the computer into which it is inserted. By way of example, interface 24 connects to a PCI bus, a VME bus, and the like. Not shown on NIC 10 is other circuitry such as a microprocessor, boot PROM, memory, etc.

NIC 10 illustrates an example of how a computer (or other hardware device) interfaces to a network communications cable (such as an Ethernet cable). As can be seen from FIG. 1, the interface requires not only jack 16, but also discrete analog components 18, and two separate integrated circuits 20 and 22, all of which are spread out over a substantial portion of NIC 10.

Although able to operate correctly, such a design has a number of inherent drawbacks. Primarily, the physical separation of the various components from jack 16 leads to noise, impedance and radiation difficulties. For example, jack 16 may be separated from analog components 18, transceiver 20, and MAC 22 by a number of inches. This separation allows noise to interfere with the analog signal and requires that a board designer make allowances for the noise. In addition, because signals are traveling over relatively large distances on metal traces on NIC 10, there is a greater problem with electromagnetic radiation. Not only is there a problem with electromagnetic radiation being received from other hardware on the card and from within the computer, but also components 16–22 produce a certain amount of electromagnetic radiation themselves. The fact that they are physically separated only aggravates the noise and radiation problems. Because radiation is produced, any such design of a NIC 10 must comply with FCC regulations. Also, because jack 16 is separate from transceiver 20, a designer must also match the impedance between the two, thus requiring extra work and increase cost for the designer.

Because of the separation of all these components, a manufacturer of a transceiver 20 and/or a MAC 22 is required to provide specifications for these devices which includes the resistors, capacitors and coils needed. The integrated circuit manufacturer must also provide specifications for optimal distances to jack 16, locations for the discrete components, etc. Even after supplying all of these specifications, a manufacturer who has produced a high quality transceiver 20 or MAC 22 must still rely upon a board manufacturer to abide by all of the specifications and to correctly design the placement of components and the routing of signals on a device such as NIC 10. If a board manufacturer fails to follow specifications or does not allow for noise, impedance matching, electromagnetic radiation, etc., such a NIC 10 will not function properly with a network communications cable even though the best efforts of an integrated circuit manufacturer has produced a properly functioning transceiver 20 and media access controller 22.

Another drawback to having various components on NIC 10 separated by relatively large distances is that the communications protocol being used may not be able to operate at as high a speed as desired. For example, although the current standard for Ethernet communications uses a 100 Mbits/sec rate, it is more difficult to achieve higher speeds using a network interface card that has higher noise, higher inductance and higher capacitance. Furthermore, excess noise over a network communication cable means that the cable's length is limited. Because the signal attenuates over a lengthy cable, introduction of noise on the cable from a network interface card would make a relatively weak signal on a longer cable hard to detect at the other end.

Other prior art techniques attempt to address this separation of components problem but each have their own drawbacks involving complexity, size, cost, etc. One technique uses a multi-chip module. In one variation, both the transceiver and MAC dies are placed into one package.

Although this technique results in the transceiver and MAC being closer to one another, it is still an expensive technique. And even though the transceiver and MAC are within the multi-chip module, the necessary resistors, capacitors and coils are still mounted outside the package. Having the components external to the package means that their sizes and locations must be specified and there is the possibility of excess noise and electromagnetic interference. As discussed above, a manufacturer of such a multi-chip module must still rely upon a board designer to use the correct discrete components and to place them correctly. In addition, such a multi-chip module has a great number of output pins and appears to the external world as two devices; thus more space is taken up and the module is more costly to use.

Furthermore, because the transceiver incorporates both digital and analog technology, the geometry used for manufacturing the transceiver is constrained by limitations on miniaturization of analog technology. For example, currently analog geometry lags behind the miniaturization of digital technology. Analog geometry is down at the 0.5 to 0.8 micron size, while digital geometry is down to the 0.25 micron size and below. Because the transceiver incorporates both digital and analog technology, a single process used to manufacture the transceiver uses the larger analog geometry. Such a larger geometry is inefficient for digital technology.

Use of analog geometry sizes for a transceiver that incorporates a high percentage of digital technology means that such a transceiver cannot be made as small as desired. As digital technology takes up more of a percentage of a transceiver, this presents a problem. For example, in the early days of Ethernet a transceiver chip communicating using 10Base5 protocol (10 Mbits/sec) was mostly all analog technology and included about 100 gates total. Thus, the small amount of digital technology (if any) that had to be produced using an analog process geometry was not a large problem. As more and more digital technology is used in a transceiver, and the gate count increases, it becomes problematic if the digital technology within the transceiver must be produced using a larger analog geometry. For example, current Ethernet transceivers using 100BaseTX (100 Mbits/sec) protocol are approximately 50% digital technology and have a substantial number of gates. It is projected that the upcoming gigabit Ethernet technology (1000BaseT) will be 90% digital technology and will have approximately 700,000 gates.

With this relatively large number of gates, suddenly the size of the gates is very significant. If such a transceiver were manufactured using an analog geometry of 0.5 microns, it would likely be too large and too expensive for all practical purposes. A more advanced analog geometry of 0.22 microns could be attempted, but this in itself would be risky and expensive. Thus, even though one technique places both a transceiver and a MAC into a multi-chip package, the transceiver itself cannot be made as small as desired because it is constrained by the size of the analog geometry that can be used. It is possible to use both a larger analog geometry process and the smaller digital geometry process on a single die, but this procedure is complex and expensive. For cost reasons, it can be prohibitive to use two different processes to manufacture a single die.

A second technique available is to use a hybrid device implemented with thick film technology to place one or more dies into one package. Hybrid technology has some advantages in that a transceiver die and a MAC die placed into such a package may be wired directly together, and any needed resistors and capacitors can be mounted close to the devices inside the hybrid package. A lead frame surrounding the hybrid package connects the devices within to the outside world. Unfortunately, hybrid technology uses a ceramic or printed circuit board substrate which is extremely expensive. Such a substrate does not dissipate heat well, which can lead to overheating problems. Also, a hybrid package can be relatively large, has a large number of output pins and is unable to incorporate an inductance coil within it. Any needed coils must still be mounted external to the hybrid device and at such a distance that may cause some of the noise problems described above.

A third technique in use is to incorporate both the transceiver and the MAC into a single integrated circuit die. Termed a mixed-signal design, such a die incorporates both the analog and digital technology of the transceiver and the MAC. One example of such a die is the Intel 82558 device. Such a device is relatively large and suffers from some of the same drawbacks as the multi-chip package. As described above, because the die incorporates both analog and digital technology, the processing technique used to manufacture the die is constrained by the currently available analog geometry size of about 0.5 to about 0.8 microns. (Currently, a geometry size down to about 0.35 microns is very nearly impossible using analog processing techniques.) It would be possible to use two different processes for manufacturing the die, but this is a complex and expensive undertaking. A further disadvantage to incorporating both a transceiver and a MAC into a single die is that both the analog functionality and the digital functionality share a common ground and power, thus introducing unwanted noise into the device. Excess noise creates problems at higher communication speeds and for longer lengths of cable.

Older prior art techniques have used two separate integrated circuits, one incorporating an analog transceiver and the other incorporating the digital functionality of the MAC. Although this technique would separate analog and digital functionality (thus allowing for different processes to be used for each device), the two devices would still be separated by a relatively large distance when mounted on a board. Separating an analog device from a digital device in this form would require more space on a board and would also add inductance to the system.

Another issue with existing jacks is their size. The amount of board space taken up by the jack and associated circuitry affects price and design complexity. It is generally desirable to have a higher board density. Jack 16 may also include two optional light-emitting diodes (LEDs) that are found in the upper portion of the face of the jack to the sides. These LEDs help monitor the transceiver status, but as they are bulky, they increase the width of the jack to greater than its standard size. In an environment such as a network switch where a large number of jacks may be mounted one adjacent to another, this slight increase in the size of each jack means that a larger portion of a printed circuit board is used up. The use of electromagnetic shielding around a jack also increases its width.

Therefore, it would be desirable to have an apparatus that places in close proximity a socket connector (or a plug connector), an integrated circuit and associated circuitry to address the above drawbacks. It would be further desirable for such an apparatus to be inexpensive to manufacture and easier for designers to incorporate into their network communication designs. It would be also desirable to implement a socket (or plug) that maintained its minimal, standard width while at the same time providing monitoring LEDs and appropriate shielding.

SUMMARY OF THE INVENTION

To achieve the foregoing, and in accordance with one purpose of the present invention, an integrated module is disclosed that incorporates not only a cable socket, but also a chip carrier for an integrated circuit and a daughter card for discrete components. In an alternative embodiment, an integrated module incorporates a cable plug and a chip carrier for an integrated circuit. The present invention provides a simple, elegant solution in an all-in-one package that provides numerous advantages: a single integrated module improves the quality and reduces the cost for a network interface.

In one aspect of the invention, an entire network interface card is contained within an integrated module that is about the same width and height of a standard socket and slightly longer. Alternatively, instead of the integrated module including a socket, the module integrates a plug of a network cable along with a chip carrier. The module does not require a slot in a computer mother board and can be mounted conveniently on any printed circuit board, within a switch, router, hub or other network device. The module may also be mounted on any device that does not have room for a standard network interface card, such as a laptop computer, a hand-held device (personal digital assistant, etc.), instrumentation, etc. The module may even be mounted external to a computer, or in a wall socket.

Integrating a socket, chip carrier and daughter card within one module provides numerous advantages. Because the integrated module is very compact (compared to prior art transceivers and discrete components that may be spread out over a network interface card), the present invention saves space on a printed circuit board and allows more room for other components. Also, because the distance between the socket, the transceiver and its associated resistors, bypass capacitors, noise filtering capacitors and coils is extremely small, noise and impedance problems are negligible. In one aspect of the invention, the resistors, capacitors and coils are grounded as closely as possible to the bonding pads of an associated integrated circuit. Thus, noise is reduced and impedance matching is not needed. Furthermore, because connections to and from the socket, transceiver and discrete components are not spread out over a network interface card, the module picks up far less noise from surrounding components. Similarly, the module itself generates far less electromagnetic radiation of its own.

The reduction in noise picked up by the module and the lowered inductance and capacitance of the unit has advantages for the network communications signal itself. The integrated module can operate at much higher speeds and with greater accuracy. In addition, because there is less noise and distortion of a communication signal, a weaker signal can be picked up (or transmitted) by another transceiver at greater distances, meaning that longer network cables can be used with the present invention.

In one specific embodiment of the present invention, the functionality contained within both the transceiver and the media access controller (MAC) are split into a digital portion and an analog portion. Each of the digital and analog functionality is then implemented on a separate integrated circuit and both integrated circuits are placed next to one another in the chip carrier within the integrated module. Advantageously, the two dies are placed immediately adjacent to one another to decrease the distance between the analog and digital portions. By integrating the chip carrier directly behind the socket and by mounting a daughter card containing discrete components directly above the chip carrier, all of the components necessary for a network connection are placed in extremely close proximity thus providing the advantages discussed herein.

As network interface devices such as transceivers and MACs incorporate more and more digital logic and hundreds of thousands of gates, it is advantageous to separate digital functionality onto one integrated circuit that can be made as small as possible. Also, by avoiding a hybrid design, costs are dramatically lowered and discrete components can still be placed extremely close to the integrated circuits by use of a daughter card mounted directly above them. In a further improvement over a hybrid design, an expensive substrate (such as ceramic or PCB) is not required. The base of the chip carrier is simple metal; each die is mounted to the metal base and electrically connected to one another, as well as each die having bonding wires connected to external pins on the chip carrier. The complexities of a hybrid design in which dies and discrete components are mounted together on a single substrate are avoided.

Furthermore, because the two dies are wired together within a single chip carrier, the external pin count is greatly reduced as compared to a traditional multi-chip package. In a specific aspect of this embodiment, pins from the digital integrated circuit are bonded directly to pins from the analog integrated circuit with which they need to communicate. Further, the dies are designed such that these digital pins are close to the edge of the digital integrated circuit that is adjacent to the analog circuit, and vice-versa. In addition, implementing digital and analog technology on separate integrated circuits allows each device to have its own power and ground thus reducing noise.

In an optional embodiment of the present invention, standard shielding around a network socket is extended to surround the entire integrated module thus providing shielding for not only the socket, but also for the chip carrier and the discrete components on a daughter card. Such shielding provides protection from external noise and also prevents electromagnetic radiation from the internal components from leaking to the outside. Advantageously, such a shielded integrated module provides a compact network connection on any printed circuit board or network device that might be sensitive to electromagnetic radiation. In a further aspect of this embodiment, the metal shielding extends underneath the integrated module and contacts the copper base of the chip carrier thus allowing the surrounding metal shield to also serve as a heat sink for the chip carrier and internal components.

In a further aspect of this embodiment, any number of integrated modules may be ganged together (placed immediately adjacent to one another) and a single electromagnetic shield placed around all of the integrated modules. Thus, shielding is provided for all modules and the total width of the adjacent modules is reduced because a single shield is used to surround all modules. Having individual shields for each module would increase the overall width of the ganged unit and thus decrease valuable board space. To further decrease the width of an integrated module and provide more board space, a light pipe is used in conjunction with the socket instead of traditional light-emitting diodes (LEDs). A traditional RJ-45 socket incorporates LEDs into the upper outside portions of its face, thus increasing the width of the socket over its standard size because of the bulk of the LEDs. Advantageously, one aspect of the present invention mounts the LEDs on a daughter card behind the socket and uses a narrower light pipe to route light from an LED up to the face of the socket. Using this technique, monitoring lights are provided yet the socket may be kept to its minimal possible width.

In another embodiment of the invention, a chip carrier by itself has pins bent both downward to attach to a printed circuit board and upward to attach to an above daughter card. By providing a chip carrier with pins bent in both directions, a daughter card may be manufactured separately from the chip carrier and then attached later. In this embodiment, a manufacturer of integrated circuits is able to concentrate their expertise on chip making; finished chips are mounted within the chip carrier. The manufacturer of daughter cards is able to concentrate their expertise on the assembly of printed circuit boards. Either manufacturer or a third party may then assemble both finished products, the chip carrier containing chips and the daughter card, in a simple fashion. Advantageously, the chip carrier of this embodiment facilitates this division of labor and ease of assembly by providing a carrier that has pins bent upward to attach to a printed circuit board, and pins bent downward to interface to a particular device such as computer board, network switch, hub, router, etc.

The present invention greatly reduces the costs associated with producing a network connection. By incorporating any number of integrated circuits into a single chip carrier, the number of output pins are reduced and the chip carrier appears to the external world as a single integrated circuit, thus reducing costs. Furthermore, standard processing techniques are used to produce the digital and the analog integrated circuits, thus avoiding high costs associated with multi-chip packages, hybrid devices, and mixed-signal technology. Also, because all components needed for a network connection are integrated into a single package, no extra design need be performed by a system integrator or board manufacturer, thus reducing their costs. In addition, because the integrated module takes up far less board space, it is less expensive to implement in terms of board space used.

BRIEF DESCRIPTION OF THE DRAWINGS

The invention, together with further advantages thereof, may best be understood by reference to the following description taken in conjunction with the accompanying drawings in which:

FIG. 1 illustrates a prior art network interface card (NIC) that includes a jack and supporting circuitry.

FIG. 2 illustrates an integrated module on a NIC according to one embodiment of the present invention.

FIGS. 24A, 24B, 24C and 24D are a side view, a bottom view, a top view and a front view, respectively, of the integrated module of FIG. 4 shown surrounded by an electromagnetic shield that also serves as a heat sink.

FIG. 25 is an alternative embodiment of the modules of FIG. 22 in which their common electromagnetic shield extends underneath the modules to contact their bases in order to serve as a heat sink for the integrated circuits mounted within.

DETAILED DESCRIPTION OF THE INVENTION

Figure 23:
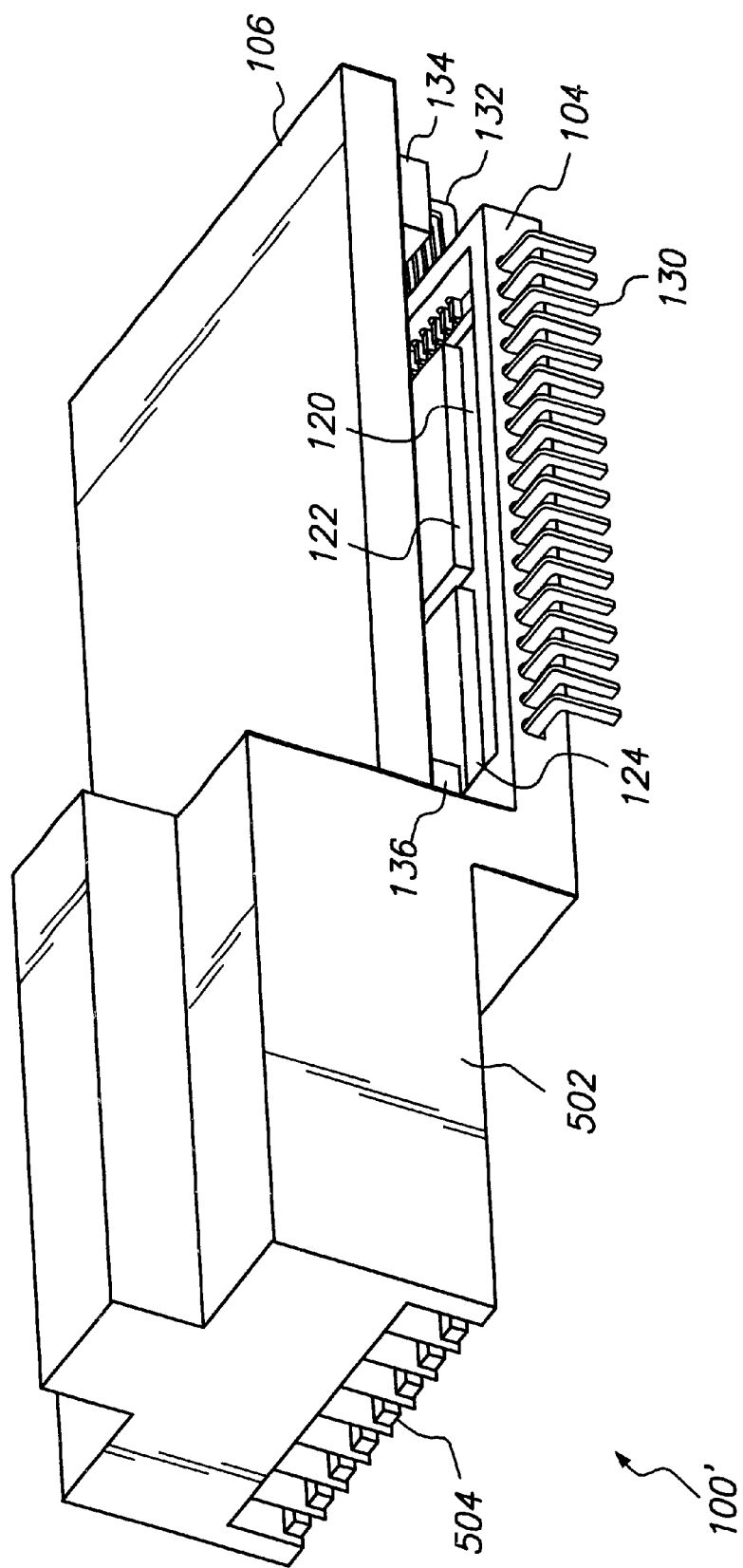
FIG. 23 is a perspective view of the integrated module according to another embodiment of the present invention in which a plug is integrated with a chip carrier.

The present invention may be implemented as either a socket or plug integrated with a chip carrier. For ease of illustration, the invention will be described using the example of an integrated socket, although a plug may be used in any of the embodiments described below. One example of an integrated plug embodiment is illustrated in FIG. 23.

The present invention provides the functionality of a network connection within an extremely small and convenient integrated module. Furthermore, because the network socket, one or more integrated circuits and all discrete components (resistors, capacitors, coil, etc.) are contained within the integrated module, the module can be used directly by a system integrator or printed circuit board manufacturer without the need to design a network interface. The integrated module comes complete with all the discrete components it requires and thus, additional specifications do not need to be supplied to a board manufacturer for the selection and placement of resistors, capacitors, coil, etc. In addition, in one aspect of the invention, the integrated module provides the same level of integration as a network interface card; serviceability is improved because a faulty integrated module may be simply removed and replaced with a functioning module.

FIG. 2 illustrates an integrated module 100 mounted on a network interface card (NIC) according to one embodiment of the present invention that includes a network cable socket, a chip carrier to hold any number of integrated circuits, and a daughter card for the mounting of discrete components. In one specific embodiment of the invention, integrated module 100 incorporates a standard RJ-45 jack that receives a standard RJ-45 plug 14 that connects to a network cable 12. However, it should be appreciated that the present invention is applicable to any of a wide variety of network connectors such as those used in fiber optics, the IEEE 1394 standard, etc., and not solely RJ-45 connectors used for Ethernet connections.

The following description will use by way of example RJ-45 connectors, although as mentioned, the invention is not so limited. Furthermore, the invention is applicable to not only Ethernet protocol communications, but also to other local area network protocols such as the IEEE 1394 protocol, the USB, etc., and wide area network protocols such as ADSL (or XDSL in general).

Advantageously, module 100 in one specific embodiment incorporates jack 16, analog circuitry 18, transceiver 20 and MAC 22 of NIC 10 as shown in FIG. 1. Other variants on this embodiment will be described below. Module 100 may be mounted on a computer motherboard, on a network interface card, on any adapter card such as a sound card, disk controller or SCSI controller, or any other suitable printed circuit board. Module 100 is also suitable for mounting within any network device such as a switch, router, hub, etc.

Figure 3:
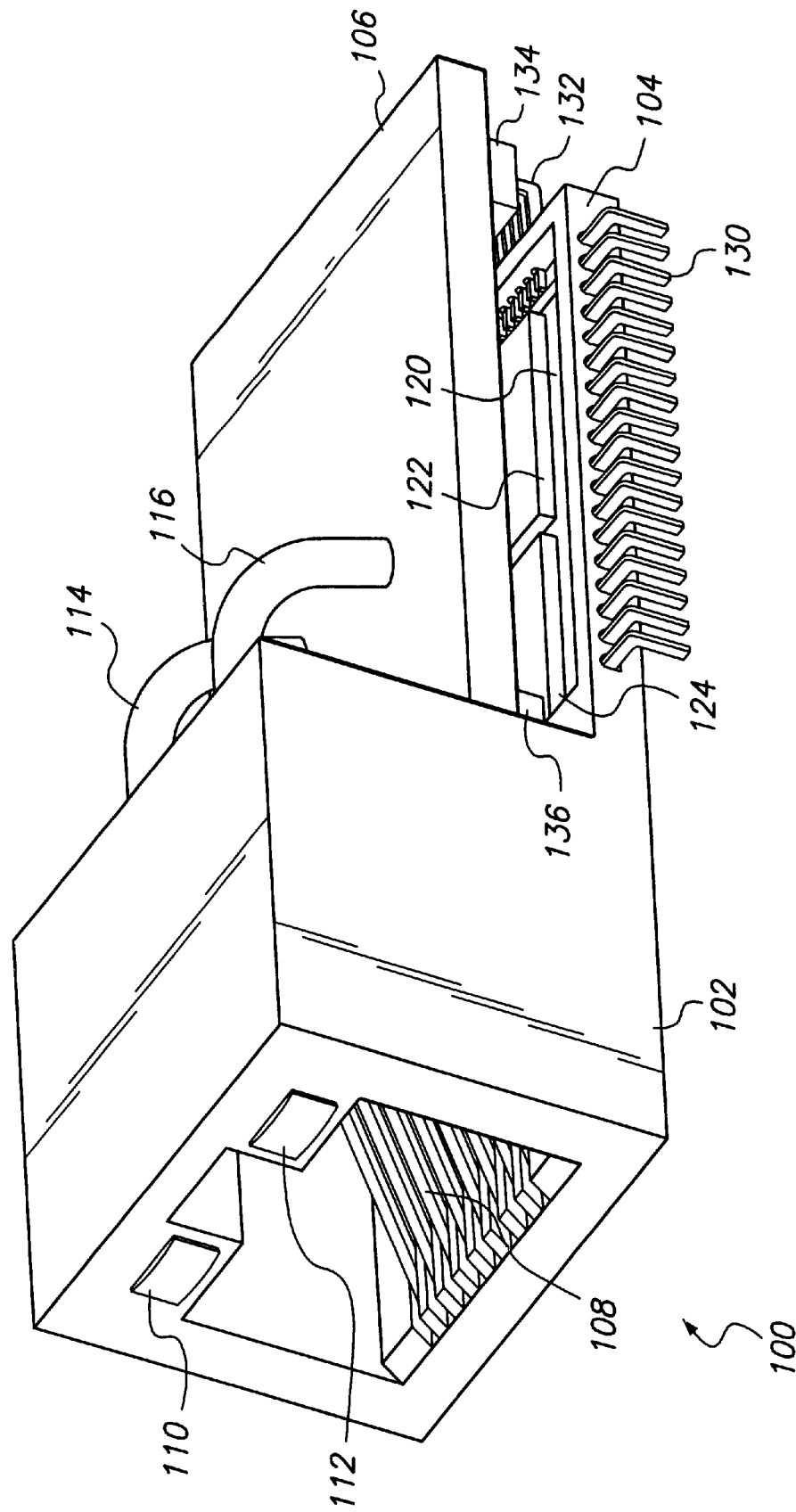
FIG. 3 is a perspective view of the integrated module according to one embodiment of the present invention.

FIG. 3 is a perspective view of integrated module 100 according to one embodiment of the present invention. Integrated module 100 includes a socket 102 integrated with a chip carrier 104 above which is mounted a daughter card 106. Preferably, socket 102 and chip carrier 104 are a single integrated unit formed from plastic. The integrated unit forms a housing that encompasses both socket 102 and chip carrier 104. In this embodiment, socket portion 102 incorporates a standard RJ-45 socket although any suitable cable socket may be incorporated. Socket 102 includes contact pins 108 and is generally shaped as is known in the art to accept an RJ-45 plug. Windows 110 and 112 are at the end of light pipes 114 and 116, respectively, and transmit light from corresponding light-emitting diodes mounted on daughter card 106 through the light pipes. Light pipes 114 and 116 may be any suitable light pipe as is known in the art. Because each light pipe is narrower than its corresponding LED, the light pipes are able to be incorporated into socket 102 without increasing its standard width. The bulkier LEDs are mounted on daughter card 106.

Chip carrier 104 is integrated with socket 102 and may be of any suitable variety of chip carriers. In one embodiment, chip carrier 104 is similar to a chip carrier known as VESPA manufactured by Panda Projects, Inc., of Boca Raton, Fla. Chip carrier 104 includes cavity 120 for accepting any number of integrated circuit dies. A single die may be mounted within cavity 120 incorporating both transceiver and MAC functionality. Or, for network devices, a single transceiver may be mounted within. In a preferred aspect of the invention, digital logic from a transceiver is combined with digital logic from a MAC to form one integrated circuit of digital technology. The analog portion of the transceiver is separated out to form a single integrated circuit of analog functionality. Advantageously, no mixed-signal design on a single integrated circuit is used, thus avoiding noise problems and/or complex double processing of a single die. Furthermore, because the digital functionality is now on its own integrated circuit, much smaller digital process geometry may be used to miniaturize this integrated circuit as much as possible without being limited by the larger analog geometry.

Preferably, therefore, mounted within cavity 120 are a die 122 that incorporates analog functionality of a network connection and die 124 that incorporates digital functionality of a network connection. Preferably, die 122 incorporates analog functionality from a network transceiver and die 124 incorporates digital functionality from a network transceiver along with media access controller (MAC) digital functionality. Dies 122 and 124 are also electrically connected to one another as will be explain in greater detail below. Dies 122 and 124 are mounted within cavity 120 using industry standard mounting technology. Although chip carrier 104 may be formed of any suitable material, preferably its base portion is of copper (or other metal) to which electromagnetic shielding may be bonded in order to provide a heat sink. Bonding of shielding to the metal base may be performed using a variety of techniques including welding, soldering, fastening gluing, etc. Other techniques may be used such as forming the shielding and base as one integral unit.

Chip carrier 104 also includes any number of a plurality of output pins 130 that electrically connect dies 122 and 124 to the outside world. Pins 130 may be electrically connected to dies 122 and 124 using any suitable technique. Preferably, bonding wires from pads of dies 122 and 124 are connected directly to interior ends of pins 130 using known techniques. For use within a computer, output pins 130 connect to a printed circuit board within the computer and eventually to the bus of the computer. Alternatively, for use with a network device such as a router, switch, hub. etc., output pins 130 interface to the forwarding logic (ASIC, processor, CAM, etc.) of the device via a system bus or direct interface, depending upon the custom design. A similar set of output pins (not shown) are found on the hidden side of module 100. Daughter card pins 132 are bent upward to facilitate electrical connection with daughter card 106 via box connector 134. Alternatively, pins 132 may be soldered directly to card 106. Any suitable number of output pins 130 and daughter card pins 132 are possible. By way of example, for a switch application in which the integrated circuit die within chip carrier 104 is a pure transceiver (without a MAC) there may be about 25 total pins. Alternatively, for a network interface card where chip carrier 104 includes integrated circuit dies having the functionality of both a transceiver and a MAC, there may be 80 output pins or more.

In this embodiment, output pins 130 to the sides of module 100 are bent downward to attach to a printed circuit board, while daughter card pins 132 are bent upward and are located to the rear of module 100. It should be appreciated that in other embodiments the downward bent pins may be found to the rear as well as the sides of module 100, and similarly that upward bent daughter card pins 132 may also be found to the sides of module 100 as well as to the rear. In one alternative embodiment of the invention, output pins 130 alternate with daughter card pins 132 around the sides and rear of module 100 in a staggered fashion. In other words every other pin is bent either upwards or downwards. Of course, other variations on the placement of these upwardly or downwardly bent pins around module 100 are possible.

Daughter card 106 connects electrically with the rear portion of contact pins 108 of socket 102 via box connector 136. Pins 132 connect from carrier 104 to daughter card 106 via box connector 134. In lieu of using box connectors 134 and 136, pins 108 and pins 132 can connect to daughter card 106 by soldering them directly to the card using a variety of known techniques. In this fashion, daughter card 106 mounts easily above carrier 104 to provide discrete components in close proximity to an integrated circuit within carrier 104. Of course, card 106 may be mounted in other locations close to carrier 104. By way of example, card 106 may be mounted below carrier 104, to its rear, to one side, etc. Daughter card 106 provides a wide variety of discrete components useful for facilitating communications such as resistors, capacitors, coils, LEDs and other components such as voltage regulators. A wide variety of other components may also be mounted on card 106 such as integrated circuits, optical diodes, laser diodes, etc.

In an alternative embodiment, it is possible for any number of daughter card pins 132 to connect directly straight down to contact a printed circuit board on which module 100 is mounted. These directly connected daughter card pins may connect exclusively to the printed circuit board or may also connect to chip carrier 104.

In this embodiment, module 100 is approximately 14 centimeters wide by 47 centimeters long by 13 centimeters high. It should be appreciated that other dimensions for module 100 are also possible. In particular, if more or larger integrated circuits are desired to be mounted within chip carrier 104, it is possible to extend the length of module 100 while keeping its width and height about the same dimensions to ensure compatibility on existing circuit boards. Module 100 may be extended to any length; more output pins and daughter card pins may be added to accommodate any number of integrated circuits within the module.

Figure 4:
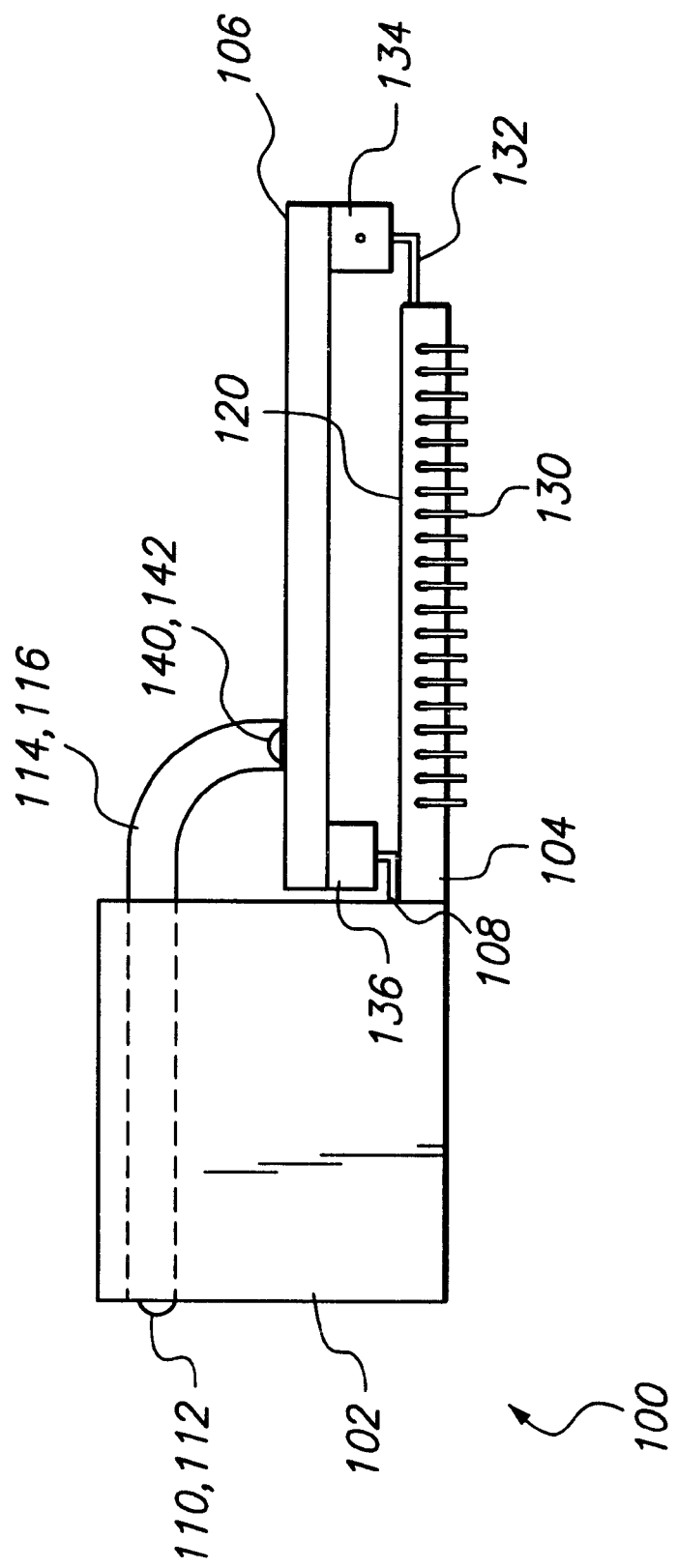
FIG. 4 is a side view of the integrated module.
Figure 5:
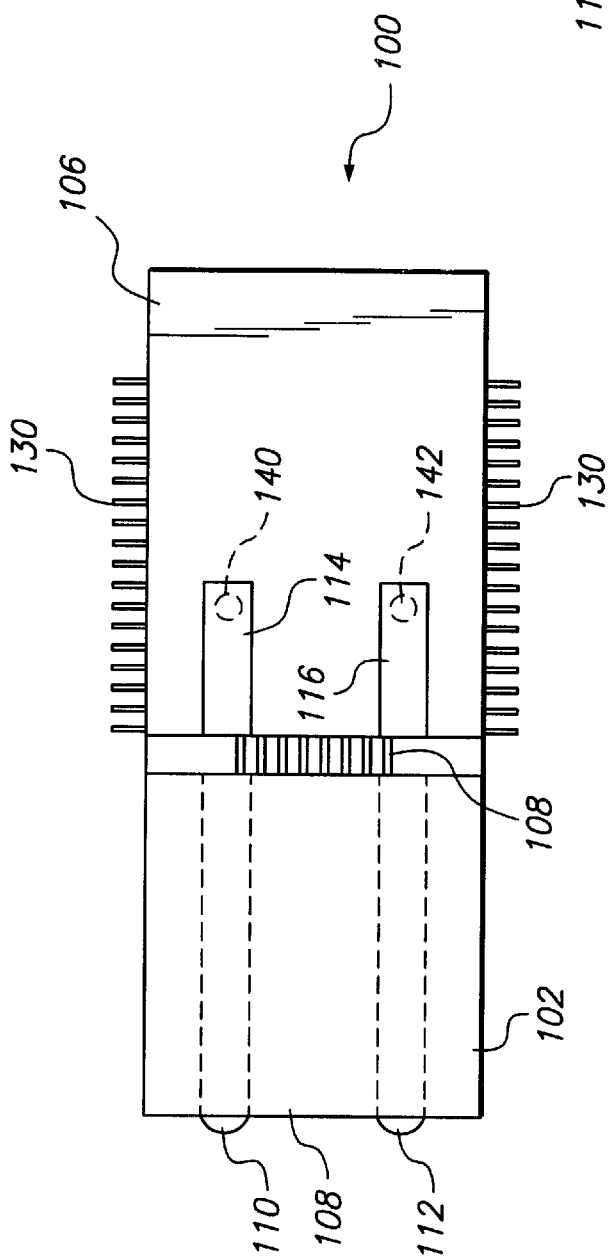
FIG. 5 is a top view of the integrated module.
Figure 6:
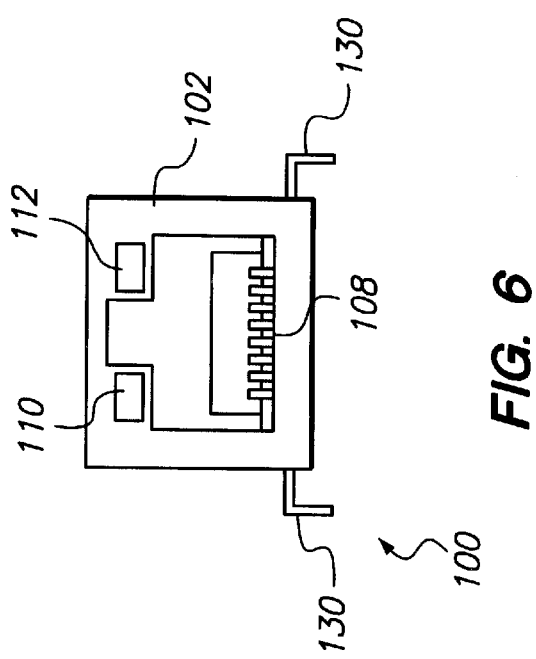
FIG. 6 is a front view of the integrated module.

FIG. 4 is a side view of integrated module 100. More clearly illustrated is the connection from the rear portion of contact pins 108 via box connector 136 to daughter card 106. Also shown are light-emitting diodes 140 and 142 mounted on the top of daughter card 106 that provide light through respective light pipes 114 and 116 to windows 110 and 112. FIG. 5 is a top view of integrated module 100. FIG. 6 is a front view of integrated module 100.

Figure 7:
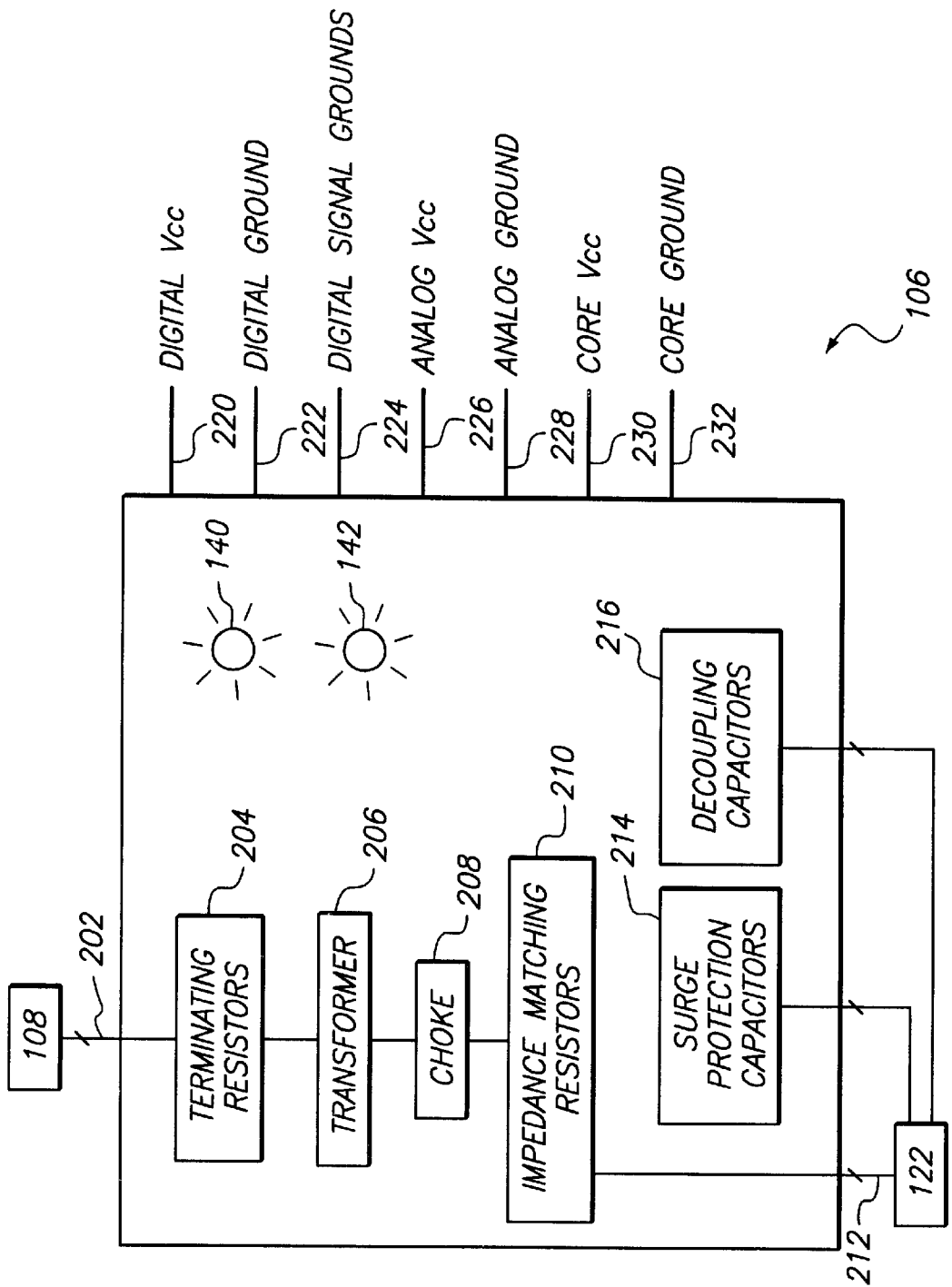
FIG. 7 is a block diagram of a daughter card according to one embodiment of the present invention.

FIG. 7 illustrates a block diagram of daughter card 106 according to one embodiment of the present invention. It should be appreciated that daughter card 106 may be implemented in a variety of manners depending on, for example, the type of jack 102 to which it connects, the number of pins 108 present within the jack, to how many integrated circuits it connects with within chip carrier 104, and other design considerations. Card 106 includes discrete components such as resistors, capacitors, inductance coils, LEDs, etc. It should be appreciated that the necessary discrete components may also be mounted at any suitable location within module 100 and not necessarily on daughter card 106. By way of example, discrete components may be mounted within socket 102, within carrier 104 or attached to the body of module 100.

Daughter card 106 receives a plurality of lines 202 from pins 108. Lines 202 connect with terminating resistors 204 to provide a termination resistance. Resistors 204 connect to a transformer 206, which in turn connects to a choke 208. Signals from choke 208 connect to impedance matching resistors 210, which in turn electrically connect the plurality of signals 212 to analog device 122. Also present on daughter card 106 are surge protection capacitors 214 and decoupling capacitors 216 which electrically connect to analog device 122 as well. Daughter card 106 also receives any number of power and ground signals. Preferably, received are digital power 220, digital ground 222, digital signal grounds 224, analog power 226, analog ground 228, core power 230 and core ground 232. Those of skill in the art will appreciate how the variety of discrete components upon daughter card 106 and the variety of signals it receives may be suitably arranged to process incoming and outgoing communication signals between network cable 12 and analog device 122.

Also shown on card 106 are LEDs 140 and 142 that provide light sources for light pipes 114 and 116. Any suitable light source may be used to provide light for light pipes 114, 116 and not necessarily LEDs.

Figure 8:
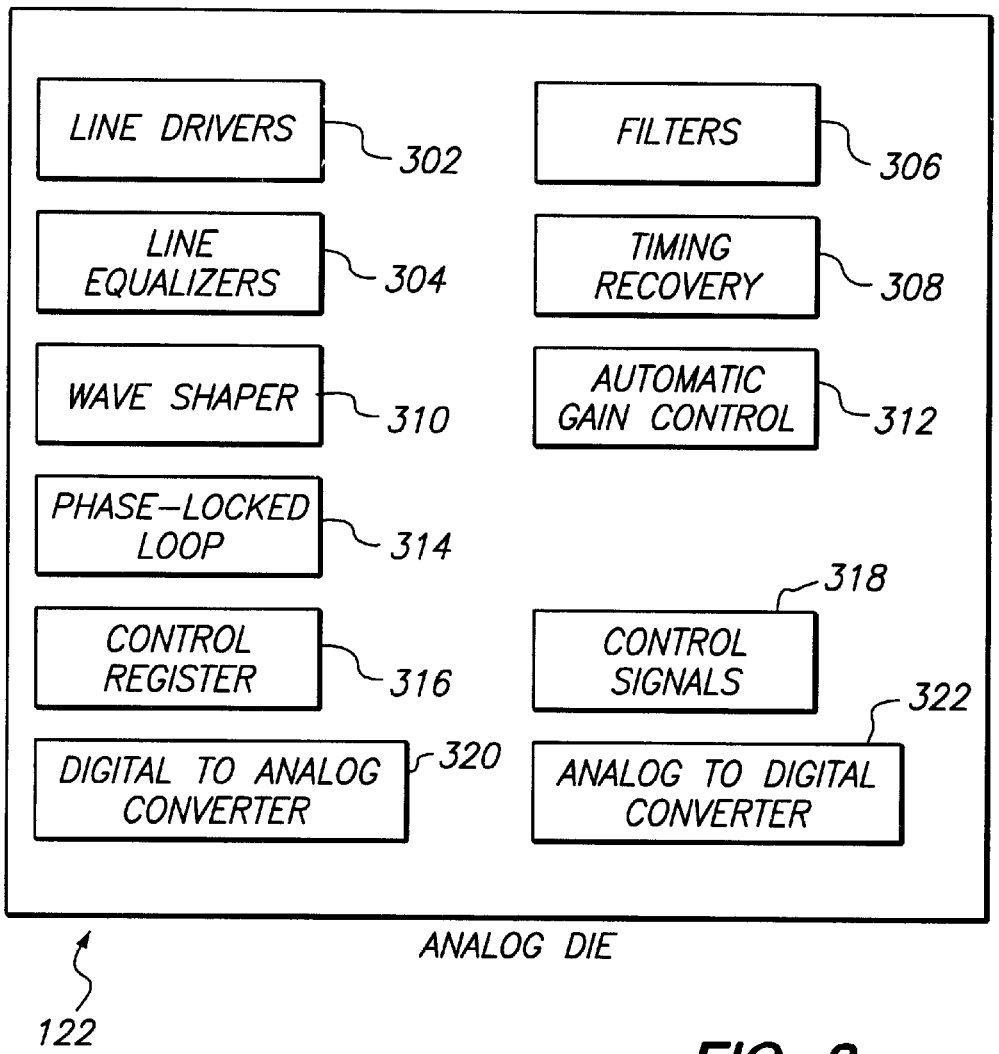
FIG. 8 is a block diagram of one embodiment for an analog die.

FIG. 8 illustrates a block diagram of one possible embodiment for analog die 122. It should be appreciated that die 122 may be implemented in many other forms; it may include fewer or greater than the number of functional blocks shown. Preferably die 122 incorporates mostly analog technology, although digital technology may also be present.

In this embodiment, analog die 122 includes line drivers 302 and line equalizers 304 used for handling communication signals received over network cable 12 via daughter card 106. Also included are filters 306, timing recovery unit 308, wave shaper 310, automatic gain control 312, phase-locked loop 314, and control register 316. Control signals 318 are used for controlling automatic gain control 312, and phase-locked loop 314. Digital-to-analog converter 320 and analog-to-digital converter 322 are used for coordinating communications back and forth between analog die 122 and digital die 124. The operation of these elements of die 122 will be appreciated by those of skill in the art.

Figure 9:
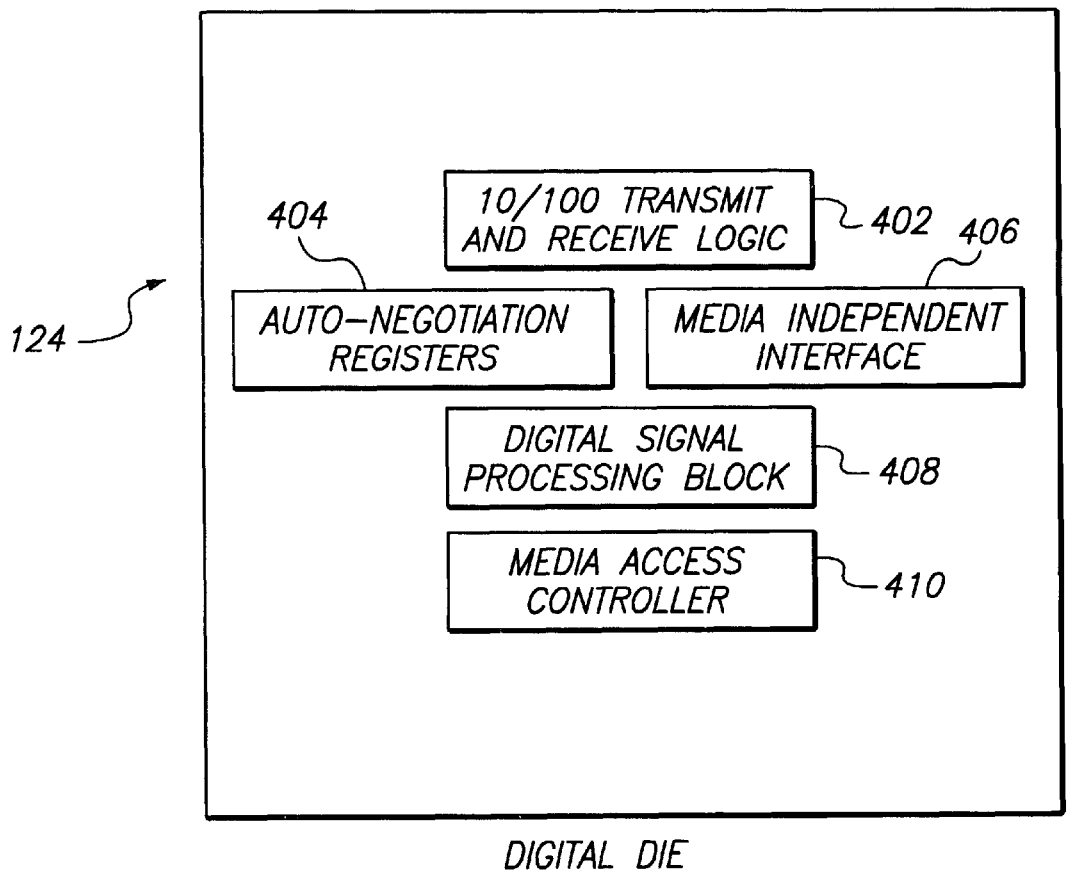
FIG. 9 is a block diagram of one embodiment of a digital die.

FIG. 9 illustrates a block diagram of one possible embodiment of digital die 124. It will be appreciated by those of skill in the art that digital die 124 may be implemented in other fashions, and may include fewer or greater than the number of functional blocks shown. Preferably die 124 incorporates mostly digital technology, although analog technology may also be present. In this particular embodiment, digital die 124 includes transmit and receive logic 402 for passing communication signals back and forth with analog die 122, auto-negotiation registers 404, and media-independent interface 406. Digital signal processing (DSP) block 408 employs standard digital processing techniques to compensate for among others, cable distortion, and to perform cross-talk suppression. Media access controller (MAC) 410 is used to coordinate communications with a system bus of a computer. Those skilled in the art of transceiver technology will appreciate how the functional blocks of FIGS. 8 and 9 may be interconnected to implement a transceiver for network communications.

Figure 10:
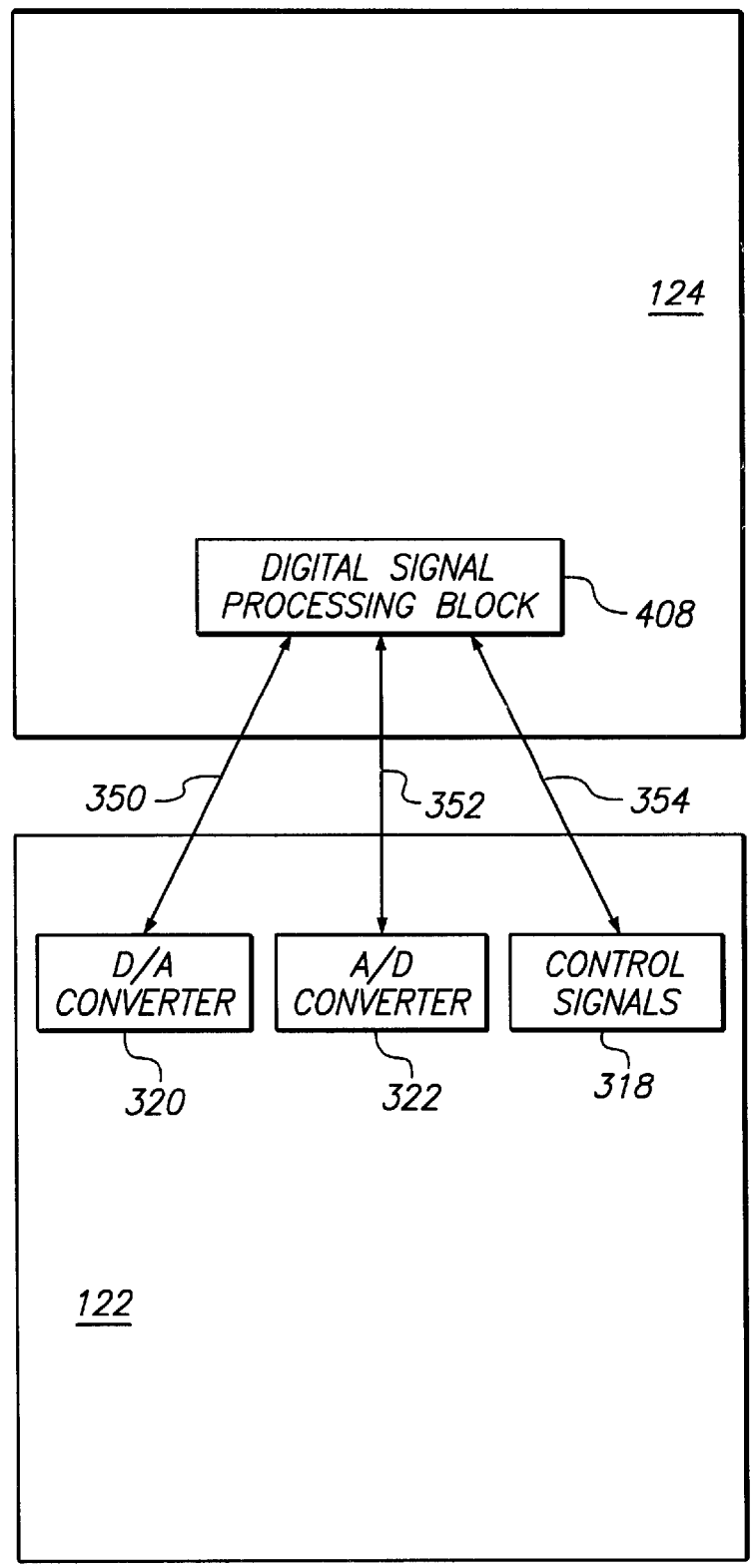
FIG. 10 is a block diagram showing a preferred orientation for the analog and digital dies.

FIG. 10 illustrates a block diagram showing a preferred implementation for analog die 122 and digital die 124. Only the relevant functional blocks are shown. In this embodiment, DSP block 408 is placed relatively close to one edge of digital die 124. Similarly, D/A converter 320, A/D converter 322 and control signals 318 of analog die 122 are placed relatively close to one edge of analog die 122. Advantageously, this placement of these functional blocks close to the edges of their respective dies permits dies 122 and 124 to be aligned such that signal lines 350, 352 and 354 are as short as possible. Short signals lines result in a simpler design and less noise. Dies 122 and 124 may be electrically connected using any suitable technique known in the art. Preferably, bonding wires directly connect die 122 to die 124 to implement the connections of signal lines 350, 352 and 354 (each of which represents a number of individual signals). Advantageously, electrical connections between dies 122 and 124 are made directly and as short as possible.

Figure 11:
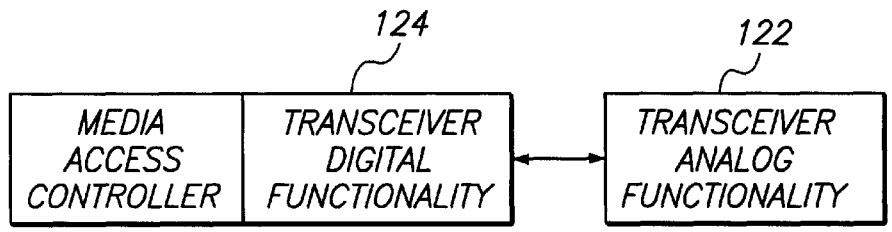
FIGS. 11–15 illustrate alternative embodiments for the functionality of integrated circuits mounted within the cavity of the chip carrier.
Figure 12:
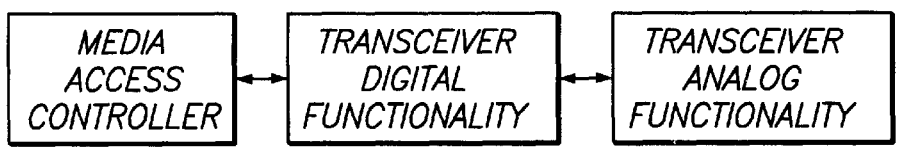
Figure 13:
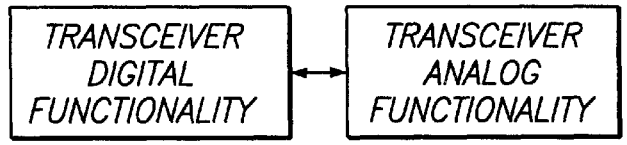
Figure 14:
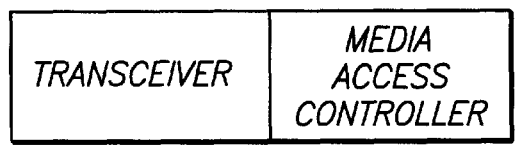
Figure 15:
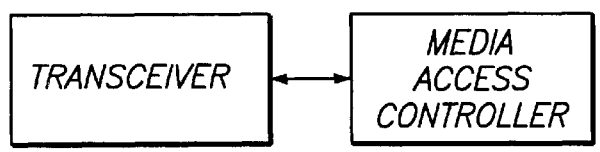

FIGS. 11–15 illustrate alternative embodiments for functionality of integrated circuits that may be mounted within cavity 120 of chip carrier 104. FIG. 11 illustrates the embodiment of FIGS. 8 and 9 in which transceiver digital functionality and a media access controller are combined into a single digital die 124, and in which the analog functionality from the transceiver is contained within analog die 122. FIG. 12 illustrates an embodiment in which three integrated circuits are contained within chip carrier 104. A media access controller is implemented on a first integrated circuit, digital functionality from a transceiver is implemented on a second integrated circuit, and analog functionality from a transceiver is implemented on a third integrated circuit. FIG. 13 illustrates an embodiment in which two integrated circuits are contained with chip carrier 104 and a media access controller is not used. In this embodiment, the digital and analog functionality from a transceiver is split into two different integrated circuits as shown. FIG. 14 illustrates an embodiment in which a single integrated circuit is mounted within chip carrier 104. In this embodiment, the single integrated circuit combines all of the transceiver functionality with the functionality of a media access controller. FIG. 15 illustrates an embodiment including a media access controller in which two integrated circuits are mounted within chip carrier 104. In this embodiment, transceiver technology is implemented on a first integrated circuit and a media access controller is implemented on a second integrated circuit as shown.

Figure 16:
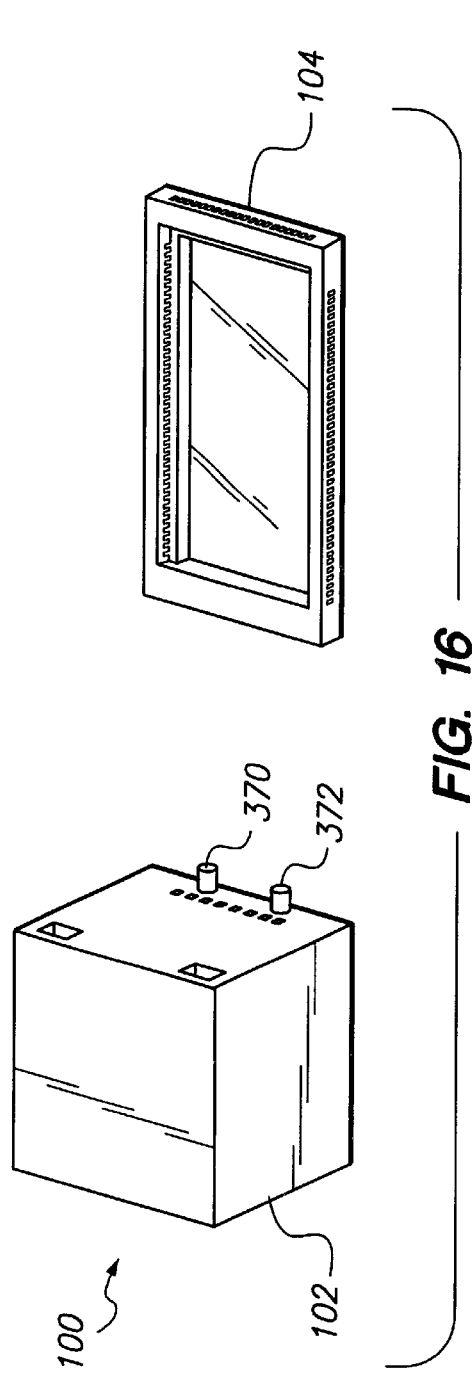
FIG. 16 illustrates an alternative embodiment for the construction of the integrated module.

FIG. 16 illustrates an alternative embodiment for the construction of integrated module 100. Shown in this embodiment are socket portion 102 and chip carrier 104. Not shown for clarity are any mounted integrated circuits, daughter card 106, etc. Shown protruding from the rear of socket 102 are ultrasonic welding protrusions 370 and 372. In this alternative embodiment, socket 102 and chip carrier 104 are plastic parts. Assembly of these two plastic parts is done using an ultrasonic welding method instead of forming integrated module 100 from a single piece. It will be appreciated by those of skill in the art that other similar techniques for forming integrated module 100 may also be used.

In another embodiment of the invention, a chip carrier by itself has pins bent both downward to attach to a printed circuit board and upward to attach to an above daughter card. By providing a chip carrier with pins bent in both directions, a daughter card may be manufactured separately from the chip carrier and then attached later. In this embodiment, a manufacturer of integrated circuits is able to concentrate their expertise on chip making; finished chips are mounted within the chip carrier. The manufacturer of daughter cards is able to concentrate their expertise on the assembly of printed circuit boards. Either manufacturer or a third party may then assemble both finished products, the chip carrier containing chips and the daughter card, in a simple fashion. Advantageously, the chip carrier of this embodiment facilitates this division of labor and ease of assembly by providing a carrier that has pins bent upward to attach to a printed circuit board, and pins bent downward to interface to a particular device such as computer board, network switch, hub, router, etc.

Furthermore, the chip carrier is of simple construction having a base for mounting integrated circuits and pins to which bonding wires from the integrated circuit may be attached. In one specific embodiment, the base is of metal to provide a more efficient heat sink. This embodiment is less complex and costly than a multi-chip modules, hybrid devices and mixed-signal devices. For example, because discrete components may be mounted on the above daughter card in close proximity to an integrated circuit in the chip carrier, a costly and complex ceramic substrate such as is used in hybrid devices is not required.

This embodiment contemplates not only a chip carrier by itself, but also a chip carrier containing one or more integrated circuits, and also a daughter card mounted on top of the chip carrier. Because components on the daughter card are mounted close to an integrated circuit in the carrier, the invention enjoys all of the advantages previously mentioned with respect to close proximity of discrete components. This embodiment is suitable for use in a wide range of applications including: network communications, switching devices, any high speed design, or in any application where a miniaturized assembly is desired.

Figure 17:
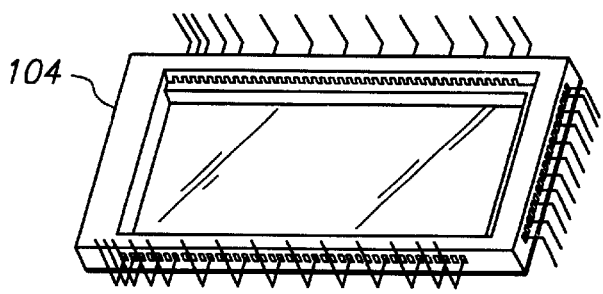
FIGS. 17–21 illustrate alternative embodiments for the chip carrier.
Figure 18:
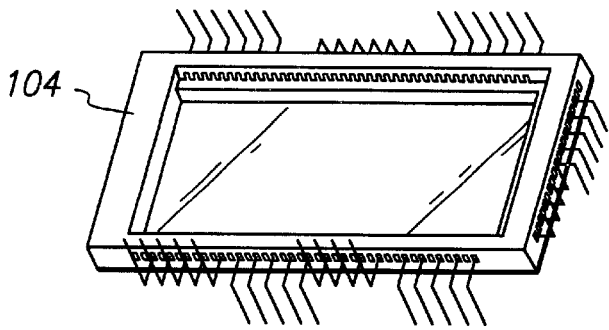
Figure 19:
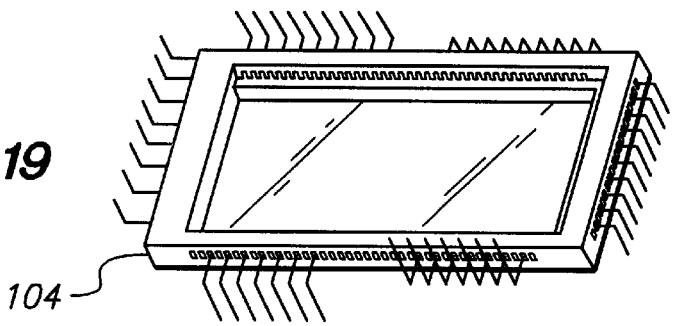
Figure 20:
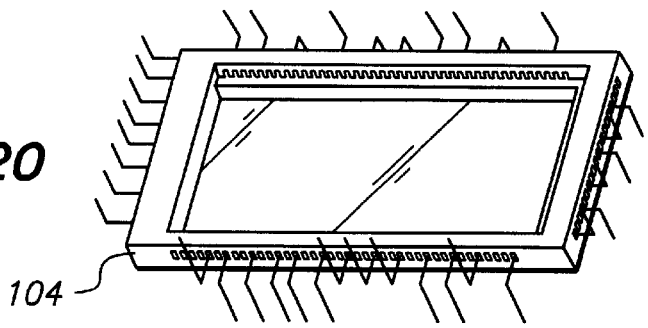
Figure 21:
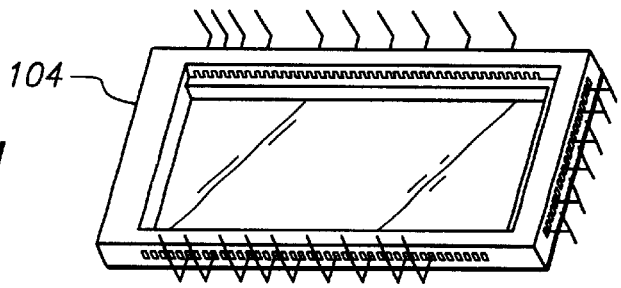

FIGS. 17–21 illustrates these alternative embodiments for chip carrier 104. As shown in FIG. 3, chip carrier 104 has a plurality of downward pointing pins 130 for connection to a mother board, computer bus, or interface to a network hardware device, and also a plurality of upward pointing pins 132 for connection to a daughter card 106 on which are mounted other components. FIG. 17 illustrates an alternative embodiment for chip carrier 104 in which pins to the sides of carrier 104 are directed upwards, while pins at one end are directed downwards. FIG. 18 illustrates an alternative embodiment for chip carrier 104 in which groups of pins around the carrier alternate pointing up or down. FIG. 19 illustrates a similar alternative embodiment for chip carrier 104 in which pins surround the carrier. FIG. 20 illustrates an alternative embodiment for chip carrier 104 in which pins mounted around the carrier are directed either upwards or downwards depending on design considerations of a daughter card to be mounted above and an interface to a computing device below. FIG. 21 illustrates an alternative embodiment for chip carrier 104 in which pins to the side of the carrier are mounted upwards, while pins at one end of the carrier connect both upwards to a daughter card above and downwards to an interface below. Pins may be mounted on carrier 104 using any suitable technique, and in one embodiment may be mounted using the techniques of Panda Projects, Inc.

Figure 22:
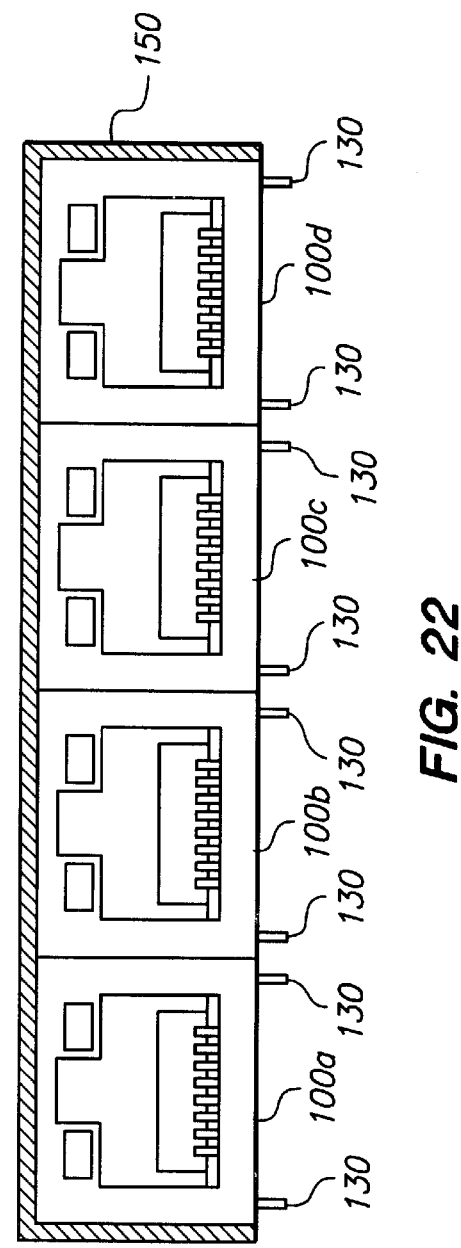
FIG. 22 illustrates an alternative embodiment in which four integrated modules are ganged together and surrounded by a common electromagnetic shield.

FIG. 22 illustrates an alternative embodiment in which four integrated modules are ganged together and surrounded by a common electromagnetic shield 150. Shown in this embodiment are four integrated modules 100a, 100b, 100c and 100d ganged together into a single unit to take up as little space as possible on a board. In this embodiment, output pins 130 are mounted directly below each module so as to not increase the width of the overall unit. Advantageously, because of the compact nature of each integrated module, a common electromagnetic shield 150 may be formed around all of the four units thus providing shielding and noise protection. If desired, shield 150 may also be bonded to the metal portion of the base of each chip carrier within each module to provide a larger heat sink. Use of light pipes mounted within each integrated module instead of LEDs being mounted within each socket further reduces the width of each module and allows the overall unit to occupy as little space as possible on the board to which it is mounted.

FIG. 23 is a perspective view of an integrated module 100' according to another embodiment of the present invention in which a plug 502 is integrated with a chip carrier 104. Plug 502 includes pins 504 that communicate electrically with card 106 and are arranged to come into contact with corresponding pins of a cable socket. Module 100' may be constructed using any of the embodiments previously described, and may include any of the features described for module 100 above. Module 100' may include solely plug 502 and empty chip carrier 104, may also include integrated circuits within the chip carrier, and may include a card 106 mounted above the chip carrier. Module 100' may have light pipes 114 and 116, and LEDs 140, 142.

FIGS. 24A, 24B, 24C and 24D are a side view, a bottom view, a top view and a front view, respectively, of integrated module 100 of FIG. 4 shown surrounded by an electromagnetic shield 152 that also serves as a heat sink. Shield 152 extends underneath module 100 and contacts the base of the chip carrier to transfer heat from an integrated circuit mounted within. Preferably, the base is of metal to provide for better heat transfer, although it may also be of other materials. Shield 152 may wrap around module 100 in different ways; in one embodiment, shield 152 wraps around the rear of module 100 as well as around its sides (except where pins 130 are located). Alternatively, shield 152 may completely encase module 100 except for holes along its sides to allow for pins 130 to exit. The holes are large enough so that pins 130 do not contact shield 152. In other embodiments, shield 152 may only partially encase module 100. As mentioned above, shield 152 is attached to the base of the chip carrier using a variety of techniques including welding, soldering, fastening gluing, etc. Heat transfer may also occur simply by shield 152 being placed into contact with the base. Advantageously, heat generated by one or more integrated circuits mounted on the base of the chip carrier 104 within cavity 120 is transferred to the base, and then on to the large electromagnetic shield 152 which then dissipates the generated heat.

FIG. 25 is an alternative embodiment of the modules of FIG. 22 in which common electromagnetic shield 154 extends underneath the modules to contact their bases in order to serve as a heat sink for the integrated circuits mounted within. Advantageously, such an embodiment allows modules to take up a minimum of space, yet still provide for heat dissipation.

Although the foregoing invention has been described in some detail for purposes of clarity of understanding, it will be apparent that certain changes and modifications may be practiced within the scope of the appended claims. The integrated module may integrate either a network cable socket or a plug with a chip carrier and other hardware. Also, the integrated module is suitable for a wide variety of plugs and network protocols. Also, it may be constructed using a variety of materials and techniques, and may take a form different than the examples shown herein. The discrete components described herein may be mounted on the daughter card printed circuit board, or at other suitable locations within the integrated module. Within the chip carrier itself may be mounted any number of integrated circuits and discrete components, and transceiver functionality may be split within the integrated circuits in different ways. In addition, the chip carrier may have pins mounted through it or upon it to connect upwards or downwards to a wide variety of cards, components, interfaces, etc. Therefore, the described embodiments should be taken as illustrative and not restrictive, and the invention should not be limited to the details given herein but should be defined by the following claims and their full scope of equivalents.

We claim:

1. An integrated module used to connect a communications cable to a hardware device, said integrated module comprising:
   a first connector arranged to mate with a corresponding second connector from a communications cable, said first connector including a plurality of contact pins arranged to contact said cable, said contact pins being further arranged to be placed into electrical communication with a transceiver mountable within said integrated module;
   a chip carrier attached closely to said first connector, said chip carrier being arranged to hold at least said transceiver, said chip carrier having a plurality of first pins that provide electrical connection from said transceiver to said hardware device and also having a plurality of second pins that provide electrical connection from said transceiver to said contact pins of said first connector; and
   a housing that integrates said first connector and said chip carrier, whereby said integrated module operates to electrically connect said communications cable to said hardware device.

2. An integrated module as recited in claim 1 further comprising:
   a transceiver mounted within said chip carrier for handling communication over said communications cable, said transceiver having first pads connected to said first pins of said chip carrier and second pads connected to said second pins of said chip carrier.

3. An integrated module as recited in claim 2 wherein said hardware device is a switch, a router or a hub.

4. An integrated module as recited in claim 2 further comprising:
   a daughter card mounted in close proximity to said chip carrier, said daughter card including a plurality of discrete components for facilitating communication between said communications cable and said transceiver, whereby said discrete components are placed in close proximity to said transceiver.

5. An integrated module as recited in claim 4 wherein the width of said integrated module is substantially the same or less than the width of a standard RJ-45 socket, and wherein the height of said integrated module is substantially the same or less than the height of a standard RJ-45 socket.

6. An integrated module as recited in claim 1 further comprising:
   a first integrated circuit mounted in said chip carrier having substantially analog technology which includes the analog functionality of a transceiver; and
   a second integrated circuit mounted in said chip carrier having substantially digital technology which includes the digital functionality of a transceiver, said first and second integrated circuits being interconnected and in electrical communication with said first pins and said second pins of said chip carrier.

7. An integrated module as recited in claim 6 wherein said hardware device is a computer and said second integrated circuit further includes:
   digital functionality of a media access controller for facilitating communication with a bus of said computer.

8. An integrated module as recited in claim 1 wherein said first connector and said second connector are respectively a socket and a plug of a network communications cable.

9. An integrated module as recited in claim 1 wherein said first connector and said second connector are respectively a plug and a socket of a network communications cable.

10. An integrated module used to connect a communications cable to a hardware device, said integrated module comprising:
    a socket arranged to accept a plug of a communications cable, said socket including a plurality of contact pins arranged to contact said cable, said contact pins being further arranged to be placed into electrical communication with a transceiver contained within said integrated module; and
    a chip carrier integrated with said socket and extending rearward therefrom and being substantially the same width as said socket, said chip carrier being arranged to hold at least said transceiver, said chip carrier having a plurality of first pins that provide electrical connection from said transceiver to said hardware device and also having a plurality of second pins that provide electrical connection from said transceiver to said contact pins of said socket, whereby said integrated module operates to electrically connect said communications cable to said hardware device.

11. An integrated module as recited in claim 10 further comprising:
    a transceiver mounted within said chip carrier for handling communication over said communications cable, said transceiver having first pads connected to said first pins of said chip carrier and second pads connected to said second pins of said chip carrier.

12. An integrated module as recited in claim 11 wherein said hardware device is a switch, a router or a hub.

13. An integrated module as recited in claim 11 further comprising:
    a daughter card mounted in close proximity to said chip carrier, said daughter card including a plurality of discrete components for facilitating communication between said communications cable and said transceiver, whereby said discrete components are placed in close proximity to said transceiver.

14. An integrated module as recited in claim 13 wherein the width of said integrated module is substantially the same or less than the width of a standard RJ-45 socket, and wherein the height of said integrated module is substantially the same or less than the height of a standard RJ-45 socket.

15. An integrated module as recited in claim 10 further comprising:
    a first integrated circuit mounted in said chip carrier having substantially analog technology which includes the analog functionality of a transceiver; and
    a second integrated circuit mounted in said chip carrier having substantially digital technology which includes the digital functionality of a transceiver, said first and second integrated circuits being interconnected and in electrical communication with said first pins and said second pins of said chip carrier.

16. An integrated module as recited in claim 15 wherein said hardware device is a computer and said second integrated circuit further includes:

digital functionality of a media access controller for facilitating communication with a bus of said computer.

17. An integrated module used to connect a communications cable to a hardware device, said integrated module comprising:

a socket arranged to accept a plug of a communications cable, said socket including a plurality of contact pins arranged to contact said cable;

a chip carrier integrated with said socket and extending rearward therefrom, said chip carrier having a plurality of first pins to provide electrical connection to said hardware device and a plurality of second pins to provide electrical connection to said contact pins of said socket;

a first integrated circuit mounted in said chip carrier having substantially analog technology which includes the analog functionality of a transceiver; and a second integrated circuit mounted in said chip carrier having substantially digital technology which includes the digital functionality of a transceiver, said first and second integrated circuits being interconnected and in electrical communication with said first pins and said second pins of said chip carrier, whereby said integrated module operates to connect said communications cable to said hardware device.

18. An integrated module as recited in claim 17 wherein said hardware device is a switch, a router or a hub.

19. An integrated module as recited in claim 17 further comprising:

a daughter card mounted in close proximity to said chip carrier, said daughter card including a plurality of discrete components for facilitating communication between said communications cable and said first integrated circuit, whereby said discrete components are placed in close proximity to said first integrated circuit.

20. An integrated module as recited in claim 19 wherein the width of said integrated module is substantially the same or less than the width of a standard RJ-45 socket, and wherein the height of said integrated module is substantially the same or less than the height of a standard RJ-45 socket.

21. An integrated module as recited in claim 17 wherein said hardware device is a computer and said second integrated circuit further includes:

digital functionality of a media access controller for facilitating communication with a bus of said computer.

22. An integrated module used to connect a communications cable to a hardware device, said integrated module comprising:

a socket arranged to accept a plug of a communications cable, said socket including a plurality of contact pins arranged to contact said cable;

a chip carrier integrated with said socket and extending rearward therefrom, said chip carrier having a plurality of first pins to provide electrical connection to said hardware device and a plurality of second pins to provide electrical connection to said contact pins of said socket;

at least one integrated circuit mounted in said chip carrier arranged to handle communication over said communications cable; and a daughter card mounted above said chip carrier and in close proximity, said daughter card including analog circuitry operating in conjunction with said at least one integrated circuit and providing electrical connection between said contact pins of said socket and said second pins of said chip carrier, whereby said analog circuitry is placed in close proximity to said integrated circuit.

23. An integrated module as recited in claim 22 wherein said hardware device is a switch, a router or a hub, and wherein said integrated circuit is a transceiver.

24. An integrated module as recited in claim 22 wherein the width of said integrated module is substantially the same or less than the width of a standard RJ-45 socket, and wherein the height of said integrated module is substantially the same or less than the height of a standard RJ-45 socket.

25. An integrated module as recited in claim 22 wherein said at least one integrated circuit includes:

a first integrated circuit having substantially analog technology which includes the analog functionality of a transceiver; and a second integrated circuit having substantially digital technology which includes the digital functionality of a transceiver.

26. An integrated module as recited in claim 25 wherein said hardware device is a computer and said second integrated circuit further includes:

digital functionality of a media access controller for facilitating communication with a bus of said computer.

27. A method of making an integrated module used to connect a communications cable to a hardware device, said method comprising:

selecting a socket arranged to accept a plug of a communications cable, said socket including a plurality of contact pins arranged to contact said cable;

integrating said socket with a chip carrier to form a single integrated module, said chip carrier extending rearward from said socket, said chip carrier having a plurality of first pins to provide electrical connection to said hardware device and a plurality of second pins to provide electrical connection to said contact pins of said socket; and mounting an integrated circuit within said chip carrier, whereby said integrated module is formed to provide an interface between said communications cable and said hardware device.

28. A method as recited in claim 27 further comprising:

mounting a daughter card in close proximity to said chip carrier, said daughter card including analog circuitry and providing electrical connection between said contact pins and said second pins, whereby said analog circuitry is provided in close proximity to said integrated circuit.

29. A method as recited in claim 27 wherein said integrated circuit is a first integrated circuit and has substantially analog technology which includes the analog functionality of a transceiver, said method further comprising:

mounting a second integrated circuit within said chip carrier having substantially digital technology which includes the digital functionality of a transceiver, said first and second integrated circuits being interconnected and in electrical communication with said first pins and said second pins of said chip carrier.

30. A method as recited in claim 29 wherein said hardware device is a computer and wherein said second integrated circuit further includes digital functionality of a media access controller for facilitating communication between said second integrated circuit and a bus of said computer.

31. An integrated module as recited in claim 6 wherein said first and second integrated circuits are mounted in close proximity, said integrated module further comprising:
bonding wires that interconnect pads of said first and second integrated circuits.

32. An integrated module as recited in claim 15 wherein said first and second integrated circuits are mounted in close proximity, said integrated module further comprising:
bonding wires that interconnect pads of said first and second integrated circuits.

33. An integrated module as recited in claim 17 wherein said first and second integrated circuits are mounted in close proximity, said integrated module further comprising:
bonding wires that interconnect pads of said first and second integrated circuits.

34. An integrated module as recited in claim 25 wherein said first and second integrated circuits are mounted in close proximity, said integrated module further comprising:
bonding wires that interconnect pads of said first and second integrated circuits.

35. A method as recited in claim 29 wherein said first and second integrated circuits are mounted in close proximity, said method further comprising:
electrically connecting said first and second integrated circuits using bonding wires.

36. An integrated module as recited in claim 1 wherein said chip carrier includes abase of metal, said integrated module further comprising:
an electromagnetic shield surrounding said integrated module that is in contact with said base of said chip carrier, whereby said electromagnetic shield also serves as a heat sink.

37. An integrated module as recited in claim 10 wherein said chip carrier includes a base of metal, said integrated module further comprising:
an electromagnetic shield surrounding said integrated module that is in contact with said base of said chip carrier, whereby said electromagnetic shield also serves as a heat sink.

38. An integrated module as recited in claim 19 wherein said chip carrier includes a base of metal, said integrated module further comprising:
an electromagnetic shield surrounding said integrated module that is in contact with said base of said chip carrier, whereby said electromagnetic shield also serves as a heat sink.

39. An integrated module as recited in claim 22 wherein said chip carrier includes a base of metal, said integrated module further comprising:
an electromagnetic shield surrounding said integrated module that is in contact with said base of said chip carrier, whereby said electromagnetic shield also serves as a heat sink.

40. A method as recited in claim 28 wherein said chip carrier includes a base of metal, said method further comprising:
placing an electromagnetic shield around said integrated module; and
forming a contact between said electromagnetic shield and said base of said chip carrier, whereby said electromagnetic shield also serves as a heat sink.

41. The integrated module as recited in claim 1 wherein the housing represents a single integrated unit.

42. An integrated module used to connect a communication cable to a hardware device, said integrated module comprising:
a housing that encompasses a first connector and a chip carrier in a single integrated unit, the chip carrier being configured for accepting at least one integrated circuit die having transceiver functionality, the chip carrier including at least one output pin that is operatively coupled to the integrated circuit die, the first connector being operatively coupled to the integrated circuit die, the first connector being configured for connection to a second connector that is coupled to the communication cable.

43. The integrated module as recited in claim 42 wherein the chip carrier is configured to receive a first integrated circuit die and a second integrated circuit die, and wherein the chip carrier includes a first output pin operatively coupled to the first integrated circuit die and a second output pin operatively coupled to the second integrated circuit die.

44. The integrated module as recited in claim 43 wherein first integrated circuit die includes analog functionality, and wherein the second integrated circuit die includes digital functionality.

45. The integrated module as recited in claim 42 wherein the housing is formed from plastic.

46. The integrated module as recited in claim 42 wherein the integrated module is mounted on a printed circuit board.

47. The integrated module as recited in claim 42 wherein the integrated module is mounted on a network interface card.

* * * * *